(12) United States Patent
Huang et al.

(10) Patent No.: US 9,508,859 B2
(45) Date of Patent: Nov. 29, 2016

(54) TFT ARRAY SUBSTRATE AND MANUFACTURING METHOD OF THE SAME

(71) Applicant: EverDisplay Optronics (Shanghai) Limited, Shanghai (CN)

(72) Inventors: Chia-chi Huang, Shanghai (CN); Min-ching Hsu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/610,217

(22) Filed: Jan. 30, 2015

(65) Prior Publication Data

US 2015/0311350 A1   Oct. 29, 2015

(30) Foreign Application Priority Data

Apr. 25, 2014  (CN) .......................... 2014 1 0172743

(51) Int. Cl.
  *H01L 29/786*  (2006.01)
  *H01L 29/66*   (2006.01)
(52) U.S. Cl.
  CPC ... *H01L 29/78633* (2013.01); *H01L 29/66757* (2013.01); *H01L 29/78675* (2013.01)
(58) Field of Classification Search
  CPC ................... H01L 29/78633; H01L 29/78603
  See application file for complete search history.

(56) References Cited

U.S. PATENT DOCUMENTS

| 2004/0155245 A1* | 8/2004 | Okumura | H01L 29/0603 257/66 |
| 2008/0203395 A1* | 8/2008 | Chao | H01L 29/78633 257/72 |
| 2009/0014721 A1* | 1/2009 | Tanabe | H01L 29/78633 257/59 |

FOREIGN PATENT DOCUMENTS

| CN | 1567549 A | 1/2005 |
| CN | 1738061 A | 2/2006 |
| CN | 101976649 A | 2/2011 |
| CN | 102543860 A | 7/2012 |

* cited by examiner

*Primary Examiner* — Ermias Woldegeorgis
(74) *Attorney, Agent, or Firm* — Yunling Ren; Eaton & Van Winkle

(57) ABSTRACT

A TFT array substrate and a manufacturing method of the same are disclosed by the present disclosure. The TFT array substrate includes a base, a light shielding layer, and a low hydrogen layer. The light shielding layer includes a silicon nitride layer formed on the base, and an amorphous silicon light shielding layer formed on the silicon nitride layer. The low hydrogen layer includes a silicon oxide layer formed on the amorphous silicon light shielding layer of the light shielding layer, and a low hydrogen Poly-Si layer formed on the silicon oxide layer. The layer number of the light shielding layer is equal to that of the low hydrogen layer. The time of manufacturing the light shielding layer matched that of manufacturing the low hydrogen layer, which enhances whole capacity of the TFT array substrate dramatically, and reduces risk of the manufacturing process.

14 Claims, 2 Drawing Sheets

TFT ARRAY SUBSTRATE AND MANUFACTURING METHOD OF THE SAME

CROSS REFERENCE TO RELATED APPLICATIONS

This application claims the priority to and the benefit of Chinese Patent Application No. 201410172743.7,filed Apr. 25, 2014 and entitled "TFT ARRAY SUBSTRATE AND MANUFACTURING METHOD OF THE SAME," which is incorporated herein by reference in its entirety.

TECHNICAL FIELD

The present disclosure relates generally to the technical field of microelectronics, particularly to TFT (thin-film transistor) array substrate and manufacturing method of the same.

BACKGROUND

A TFT array substrate is one of indispensability parts for manufacturing TFT panel. As shown in FIG. 1, a conventional TFT array substrate comprises a glass base 1, a light shielding layer 2 formed on the glass base 1, and a low hydrogen layer 3 formed on the light shielding layer 2. The light shielding layer 2 is an amorphous silicon light shielding layer 21. The low hydrogen layer 3 comprises a first silicon oxide layer 31, silicon nitride layer 32, a second silicon oxide layer 33, and a low hydrogen amorphous silicon layer 34 which are formed on the light shielding amorphous silicon layer 21 in turns.

A short time is taken to form the light shielding layer 2 because it only comprises one layer of amorphous silicon light shielding layer 21, while a long time is taken to form the low hydrogen layer 3 because it comprises four layers. Therefore, during manufacturing of the above conventional TFT array substrate, the device for forming the light shielding layer 2 is always lying idle, while the device for forming the low hydrogen layer 3 is always face a bottleneck in production, such that the production of the light shielding layer 2 does not match that of the low hydrogen layer 3, which leads to low production capacity of TFT array substrate. Moreover, many types of layers in the low hydrogen layer 3 are formed by the same machine, which will cause risks such as cross contamination.

In addition, in the conventional TFT array substrate, the second silicon oxide layer 33 under the low hydrogen amorphous silicon layer 34 is thin, which is unstable to be converged. The amorphous silicon light shielding layer 21 is directly formed on the glass base 1, which has poor anti-static electric capacity.

The foregoing information is only used for easily understanding the background of the present disclosure, which may include information in the prior art not well known by the person skilled in the art.

SUMMARY

The embodiments of the present disclosure provide a TFT array substrate, in which the quantity of layers in the light shielding layer is substantially the same with that in the low hydrogen layer, thereby beneficial to improve production capacity.

The embodiments of the present disclosure provide a manufacturing method of the TFT array substrate.

Additional aspects and advantages will be set forth in part in the description which follows and, in part, will be apparent from the description, or may be learned by practice of the disclosure.

In one aspect, the present disclosure provides a TFT array substrate comprising a base, a light shielding layer, and a low hydrogen layer. the light shielding layer comprises a silicon nitride layer formed on the base, and an amorphous silicon light shielding layer formed on the silicon nitride layer. The low hydrogen layer comprises a silicon oxide layer formed on the amorphous silicon light shielding layer of the light shielding layer, and a low hydrogen poly-Si layer formed on the silicon oxide layer.

In another aspect, the present disclosure provides a manufacturing method of a TFT array substrate, comprising the steps of:

providing a base;

forming a light shielding layer on the base; and forming a low hydrogen layer on the light shielding layer.

The foregoing summary is not intended to summarize each potential embodiment or every aspect of the present disclosure.

BRIEF DESCRIPTION OF THE DRAWINGS

The present disclosure will become more fully understood from the detailed description given hereinafter and the accompanying drawings.

DETAILED DESCRIPTION

Figure 1:
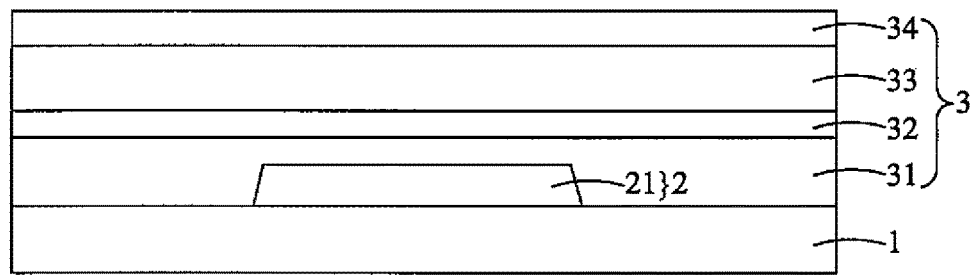
FIG. 1 illustrates a schematic view of a conventional TFT array substrate.

Exemplary embodiments of the disclosure will now be described more fully with reference to the accompanying drawings, in which exemplary embodiments are shown. Exemplary embodiments of the disclosure may, however, be embodied in many different forms and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and regions are exaggerated for clarity. Like reference numerals in the drawings denote like elements, and thus their description will be omitted.

The described features, structures, or/and characteristics of the disclosure may be combined in any suitable manner in one or more embodiments. In the following description, numerous specific details are disclosed to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

A TFT Array Substrate

Figure 2:
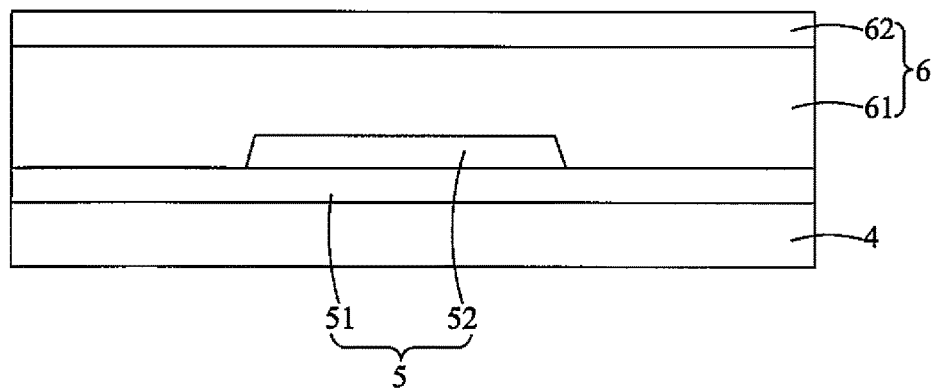
FIG. 2 illustrates a schematic view of a TFT array substrate according to an embodiment of the present disclosure.

As shown in FIG. 2, the TFT array substrate according to the present disclosure comprises a base 4, a light shielding layer 5 and a low hydrogen layer 6.

The base 4 may adopt a conventional structure, such as glass base.

The light shielding layer 5 comprises a silicon nitride layer 51 and an amorphous silicon light shielding layer 52 formed on the silicon nitride layer 51.

The silicon nitride layer 51 has the following properties and advantages: considerable breakdown voltage, relatively higher permittivity, high blocking ability so as to effectively block harmful substance in the base 4, such as alkali metal and so on; good chemical stability which allows the silicon nitride layer 51 to hardly react with other acid besides hydrofluoric acid and hot phosphoric acid; good anti-gas penetration ability which effectively reduces effect to the device due to gas and fluid penetration. Consequently, the silicon nitride layer 51 directly formed on the base 4 can work at full capacity.

The low hydrogen layer 6 comprises a silicon oxide layer 61 formed on the amorphous silicon light shielding layer 52 of the light shielding layer 5 and a low hydrogen poly-Si layer 62 formed on the silicon oxide layer 61. The low hydrogen poly-Si layer 62 of the low hydrogen layer 6 is located above the amorphous silicon light shielding layer 52 of the light shielding layer 5, and a pattern is formed on the low hydrogen poly-Si layer 62 of the low hydrogen layer 6, in particular, the pattern of the low hydrogen poly-Si layer of the low hydrogen layer 6 is located over the amorphous silicon light shielding layer 52 of the light shielding layer 5, such that the amorphous silicon light shielding layer 52 of the light shielding layer 5 may provide good light shielding effect to the low hydrogen poly-Si layer 62 of the low hydrogen layer 6.

The layer number of the light shielding layer 5 and low hydrogen layer 6 is redesigned to be the same or almost the same, such that the time for manufacturing the light shielding layer 5 matches that of the low hydrogen layer 6, which enhances whole production. Meanwhile, the type and sequence of films could be reasonably chosen according to the material property of the film, thusly optimizing the capacity and quality of the TFT array substrate.

In an embodiment of the present disclosure, the thickness of the silicon oxide layer 61 is 2 times larger than that of the low hydrogen poly-Si layer 62 of the low hydrogen layer 6.

In an embodiment of the present disclosure, the thickness of each film may be designed depending on requirement, for example, the thickness of the amorphous silicon light shielding layer 52 of the light shielding layer 5 is 60-100 nm, the thickness of the silicon nitride layer 51 is 50-100 nm, the thickness of the silicon oxide layer 61 is 200-400 nm, and the thickness of the low hydrogen poly-Si layer 62 of the low hydrogen layer 6 is 30-60 nm.

A Manufacturing Method of the TFT Array Substrate

The manufacturing method of the TFT array substrate comprises the following steps:

S1: providing a base 4, such as glass base. The glass base, for example, has the following properties: high transparency, low reflectivity, good thermal stability, corrosion resistance, electric insulation, mechanical strength and mechanical processing characteristic. The glass base is cleaned, for example, by initial cleaning process.

S2: forming a light shielding layer 5 on the base 4.

For example, the step of forming a light shielding layer 5 on the base 4 comprises the steps of forming a silicon nitride layer 51 on the base 4; and forming an amorphous silicon light shielding layer 51 on the silicon nitride layer 51.

the light shielding layer 5 comprises a silicon nitride layer 51 and an amorphous silicon light shielding layer 52 formed on the silicon nitride layer 51. The silicon nitride layer 51 may be used as a buffer layer, which is capable of inhibiting effect resulted by the harmful substance in the glass base, such as metal ions.

In an embodiment, conducting an annealing process after finishing the silicon nitride layer so as to optimize the quality of the buffer layer. And then depositing the amorphous silicon light shielding layer 52 on the silicon nitride layer 51. The silicon nitride layer 51 cooperates with the amorphous silicon light shielding layer 52 in the Step S2 to constitute the light shielding layer 5.

S3: forming a low hydrogen layer 6 on the light shielding layer 5.

For example, the step of forming a low hydrogen layer on the light shielding layer 5 comprises the steps of forming a silicon oxide layer 61 on the amorphous silicon light shielding layer 52 of the light shielding layer 5; and forming an amorphous silicon low hydrogen layer on the silicon oxide layer.

forming a silicon oxide layer 61 on the amorphous silicon light shielding layer 52 of the light shielding layer 5 for example by a manner of PECVD For example, the layer of amorphous silicon may be treated with a dehydrogenation such as being treated in a high temperature oven so as to form a low hydrogen amorphous silicon layer.

conducing a crystallization process to the amorphous silicon low hydrogen layer. For example, treating a crystallization process to the amorphous silicon low hydrogen layer to form a low hydrogen poly-Si layer 62 in a manner of crystallization treatment, such as Excimer Laser Annealing (ELA), Metal Induced Crystallization (MIC), or Solid phase Crystallization (SPC).

Furthermore, after the crystallization, cleaning the layer of poly-Si film by Dimethyl dihydroxyfumarate (DHF) with a concentration of 1-20%, so as to reduce the surface roughness of the layer of poly-Si film, and remove gauffer or protrusion brought about by crystallization, thusly enabling the layer of poly-Si film to contact with the succedent films well, and thereby promoting the performance of the whole device.

The silicon oxide layer 61 cooperates with the low hydrogen poly-Si layer 62 of the low hydrogen layer 6 to constitute the low hydrogen layer 6.

In an embodiment, the manufacturing method further comprises a step of patterning the low hydrogen poly-Si layer 62 of the low hydrogen layer 6 to form a pattern. Furthermore, the pattern of the low hydrogen poly-Si layer 62 of the low hydrogen layer 6 is located above the amorphous silicon light shielding layer 52.

A TFT array substrate can be obtained by forming gate electrode, drain electrode and source electrode and so on based on the TFT array substrate according to the present disclosure.

Based on the technical solutions of the present disclosure, some advantageous effects of the TFT array substrate according to the present disclosure may include the following:

In the present disclosure, the light shielding layer comprises two layers of films, i.e. a silicon nitride layer and an amorphous silicon light shielding layer; and the low hydrogen layer comprises two layers of films, i.e. a silicon oxide layer and a low hydrogen polysilicon layer, that is to say, the layer number of the light shielding layer is equal to the layer number of the low hydrogen layer, therefore, the time of manufacturing the light shielding layer is almost equal to that of manufacturing the low hydrogen layer, which production capacity of the light shielding layer matches that of the low hydrogen layer, and enhances whole capacity of the TFT array substrate dramatically, which lower risk of the manufacturing process.

Compared with the prior art, the TFT array substrate according to the present disclosure may reduce the layer number of the low hydrogen layer, thusly allowing to easily control the temperature of each film in the low hydrogen layer to be uniformity, decrease stress of each film in the low hydrogen layer, and lower probability of film stripping or peeling.

In the present disclosure, the silicon oxide layer with a relative larger thickness is located under the amorphous silicon low hydrogen layer, which is able to reduce heat conduction in the subsequent excimer laser annealing process, and moderate cooling rate of Si heated by laser, and is helpful to form relative larger poly-Si grains. Moreover, the silicon oxide layer with a relative larger thickness is located above the silicon nitride layer at the lowest layer, which provides a second protection for the poly-Si, and blocks the metal ions in the glass base diffusing into the poly-Si, and thereby rendering a more stable convergence.

The stress of the silicon nitride is larger than that of the silicon oxide. In the present disclosure, the silicon nitride layer is located under the silicon oxide layer, i.e, the film with the largest stress is provided at the lowest layer to connect with the base, and amorphous silicon light shielding layer of the light shielding layer is located above the silicon nitride layer, which is capable of increasing connection strength between each layer and effectively preventing film stripping.

the silicon nitride layer is located above the base, which may directly block ions in the base, such as Na, K, P and so on during a high temperature process of Low Temperature poly-Si (LTPS), without effecting the uniformity and pureness of the light shielding layer, and the quality of the amorphous silicon light shielding layer of the light shielding layer, thereby optimizing the characterize of the TFT array substrate. Meanwhile, the light shielding layer is prevented from electrostatic damage because the silicon nitride is provided on the base.

It should be noted that the above embodiments are only illustrated for describing the technical solution of the disclosure and not restrictive. On the contrary, the present disclosure intends to encompass such changes and modifications provided that those changes and modifications fall within the scope of claims of the present invention and equivalents thereof.

What is claimed is:

1. A TFT array substrate comprising:
   a base;
   a light shielding layer comprising:
      a silicon nitride layer formed on the base; and
      an amorphous silicon light shielding layer formed on part of the silicon nitride layer; and
   a low hydrogen layer comprising:
      a silicon oxide layer, which is a unitary layer, formed directly on both the amorphous silicon light shielding layer and the silicon nitride layer of the light shielding layer, the amorphous silicon light shielding layer is surrounded by the silicon oxide layer and the silicon nitride layer of the light shielding layer; and
      a low hydrogen Poly-Si layer formed on the silicon oxide layer.

2. The TFT array substrate according to claim 1, wherein a pattern is formed on the low hydrogen Poly-Si layer of the low hydrogen layer, and the amorphous silicon light shielding layer of the light shielding layer provides light shielding to the pattern of the low hydrogen Poly-Si layer of the low hydrogen layer.

3. The TFT array substrate according to claim 1, wherein the thickness of the silicon oxide layer is 2 times larger than that of the low hydrogen Poly-Si layer of the low hydrogen layer.

4. The TFT array substrate according to claim 1, wherein the thickness of the amorphous silicon light shielding layer of the light shielding layer is 60-100 nm.

5. The TFT array substrate according to claim 1, wherein the thickness of the silicon nitride layer is 50-100 nm.

6. The TFT array substrate according to claim 1, wherein the thickness of the silicon oxide layer is 200-400 nm.

7. The TFT array substrate according to claim 1, wherein the thickness of the low hydrogen Poly-Si layer of the low hydrogen layer is 30-60 nm.

8. A manufacturing method of a TFT array substrate, comprising the steps of:
   providing a base;
   forming a silicon nitride layer on the base; and
   forming an amorphous silicon light shielding layer on part of the silicon nitride layer;
   directly forming a silicon oxide layer on both the amorphous silicon light shielding layer and the silicon nitride layer of the light shielding layer, the silicon oxide layer is a unitary layer, the amorphous silicon light shielding layer is surrounded by the silicon oxide layer and the silicon nitride layer of the light shielding layer; and
   forming an amorphous silicon low hydrogen layer on the silicon oxide layer.

9. The manufacturing method according to claim 8, further comprising a step of conducting a crystallization process to the amorphous silicon low hydrogen layer to form a low hydrogen Poly-Si layer of the low hydrogen layer.

10. The manufacturing method according to claim 9, wherein the thickness of the low hydrogen Poly-Si layer of the low hydrogen layer is 30-60 nm.

11. The manufacturing method of the TFT array substrate according to claim 9, further comprising a step of patterning the low hydrogen Poly-Si layer of the low hydrogen layer to form a pattern.

12. The manufacturing method according to claim 8, wherein the thickness of the amorphous silicon light shielding layer of the light shielding layer is 60-100 nm.

13. The manufacturing method according to claim 8, wherein the thickness of the silicon nitride layer is 50-100 nm.

14. The manufacturing method according to claim 8, wherein the thickness of the silicon oxide layer is 200-400 nm.

* * * * *